United States Patent [19]

Berglund et al.

[11] Patent Number: 4,902,377
[45] Date of Patent: Feb. 20, 1990

[54] SLOPED CONTACT ETCH PROCESS

[75] Inventors: Robert K. Berglund, Mesa, Ariz.;
Karl E. Mautz, Austin, Tex.

[73] Assignee: Motorola, Inc., Schaumburg, Ill.

[21] Appl. No.: 355,574

[22] Filed: May 23, 1989

[51] Int. Cl.⁴ .................. B44C 1/22; C03C 15/00;
C03C 25/06; B29C 37/00
[52] U.S. Cl. ........................... 156/643; 156/644;
156/646; 156/651; 156/653; 156/655; 156/657;
156/659.1; 204/192.36; 204/192.37; 437/195;
437/203; 437/238; 437/241
[58] Field of Search ............... 156/643, 644, 646, 651,
156/653, 655, 657, 659.1, 662; 204/192.32,
192.36, 192.37; 427/38, 39; 357/65, 67, 71;
437/189, 195, 203, 228, 241, 245, 246

[56] References Cited

U.S. PATENT DOCUMENTS

| | | | |
|---|---|---|---|
| 4,352,724 | 10/1982 | Sugishima et al. | 156/643 X |
| 4,698,128 | 10/1987 | Berglund et al. | 156/643 |
| 4,715,930 | 12/1987 | Diem | 437/101 |
| 4,832,788 | 5/1989 | Nemiroff | 156/643 |

Primary Examiner—William A. Powell
Attorney, Agent, or Firm—Joe E. Barbee

[57] ABSTRACT

A method for etching vias having sloped sidewalls is provided, wherein the vias are formed in an interlayer dielectric formed on top of an interconnect layer using a patterned photoresist film as a mask. A top portion of the via is formed with a wet etch process which isotropically undercuts the masking film thereby creating a sloped sidewall. A bottom portion of the via is formed by a dry etch process comprising the steps of alternating between a number of isotropic mask erosion steps and a number of anisotropic dielectric etch steps, so that the interlayer dielectric exposed to the anisotropic etch by the mask opening is enlarged with each mask erosion step. Thus, a slope is created on the dry etched portion of the via sidewall as well as the wet etched portion of the via sidewall.

13 Claims, 2 Drawing Sheets

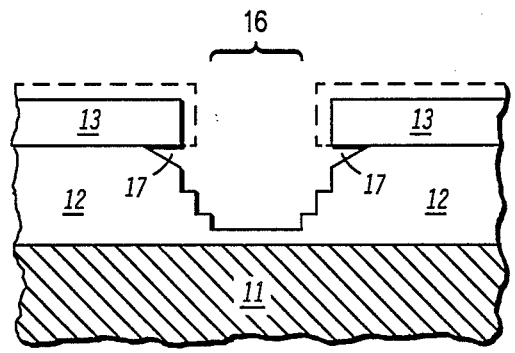
FIG. 4
FIG. 5
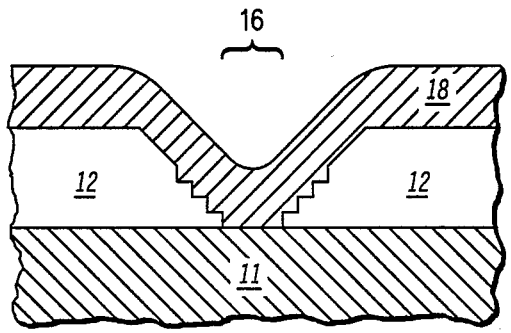

SLOPED CONTACT ETCH PROCESS

BACKGROUND OF THE INVENTION

The present invention relates, in general, to contact etch processes and, more particularly, to sloped contact etches in multilayer metal systems.

Semiconductor integrated circuits comprise a plurality of circuits and devices which are interconnected by one or more patterned metal layers, also called interconnect layers, formed on a top surface of the integrated circuits. The interconnect layers are separated from each other and the circuit by interlayer dielectric films. As device dimensions approach the submicron level, one limiting factor for further reduction in size is area required for device interconnections. A major component of interconnect area is the size of contact windows, or vias, which are selectively etched in the interlayer dielectric. Contact windows are etched to expose portions of the underlying circuit or a lower interconnect layer. An upper interconnect layer is formed on top of the interlayer dielectric and in contact with the underlying circuit or the lower interconnect layer through the contact window.

Etch processes used to form contact windows can be classified generally as wet or dry. Wet etch processes are usually isotropic and thus undercut the masking layer somewhat while vertically etching the dielectric layer. Dry etch processes are highly anisotropic and create vertical sidewalls with the top and bottom of the contact window having substantially the same dimensions. Wet etch processes are undesirable for submicron geometries because the undercut significantly increases the lateral area required for the contact window. Though dry etch processes are compatible with the submicron dimensions of contact windows, the vertical sidewalls result in a via which is difficult to fill when the upper interconnect layer is deposited.

Interconnect layers deposited by conventional metal deposition methods become less reliable as the size of the contact window becomes comparable to the thickness of the interlayer dielectric. Deposited metal does not conform to the contours of the contact window especially at sharp corners, resulting in thin metal and voids when contact windows are small. This is a particular problem when dry etch processes are used and sidewalls of the via are vertical. In these cases, which are common in submicron geometry devices, the sidewalls of the via must be sloped to improve metal step coverage. One such sloped contact etch process is described in U.S. Pat. No. 4,698,128 issued to Berglund et al and assigned to the same assignee as the present invention. The Berglund et al method was a modified dry etch process which creates a stepwise sloped sidewall of the contact window. This process, however, required a time consuming dry etch cycle, and so was not desirable for via etches in thick dielectric layers. Another method is discussed in U.S. Pat. No. 4,352,724 issued to Sugishima et al. The Sugishima et al method used an isotropic etch to form a top portion of the via, followed by a single dry etch to form a bottom portion of the via. Though the Sugishima et al process was suitably fast for thick dielectric etches, a corner was formed at an interface of the isotropically etched region and the dry etch region. This corner created a metal step coverage problem similar to that created when no sloped etch process was used. Also, the anisotropic etch used by Sugishima et al caused a polymer veil to form inside the via which was difficult to remove. The polymer veil would either remain in the via, which caused poor metal contact, or break away in subsequent processing and redeposit on other portions of the semiconductor device, which created defects on the other portions of the device.

Accordingly, it is an object of the present invention to provide a method for producing a sloped contact via which results in improved metal step coverage.

It is a further object of the present invention to provide a method for producing a sloped contact window in a thick dielectric layer with a short processing time.

It is a further object of the present invention to provide a method for producing a sloped contact window in a thick dielectric layer which eliminates polymer veils.

It is a still further object of the present invention to provide a method for producing a sloped contact window in a thick dielectric layer with improved metal step coverage of via sidewalls resulting in improved reliability.

SUMMARY OF THE INVENTION

The above and other objects and advantages of the present invention are achieved by providing a method for etching vias in an interlayer dielectric formed on top of an interconnect layer using a patterned photoresist film as a mask. A top portion of the via is formed with a wet etch process which isotropically undercuts the masking film thereby creating a sloped sidewall. A bottom portion of the via is formed by a dry etch process comprising the steps of alternating between a number of isotropic mask erosion steps and a number of anisotropic dielectric etch steps, so that the interlayer dielectric exposed to the anisotropic etch by the mask opening is enlarged with each mask erosion step. Thus, a slope is created on the dry etched portion of the via sidewall as well as the wet etched portion of the via sidewall.

BRIEF DESCRIPTION OF THE DRAWINGS

FIGS. 1-5 illustrate cross-sectional views of a top portion of a semiconductor device embodying a sloped via etch contact process of the present invention at various stages of fabrication.

DETAILED DESCRIPTION OF THE DRAWINGS

Figure 1:
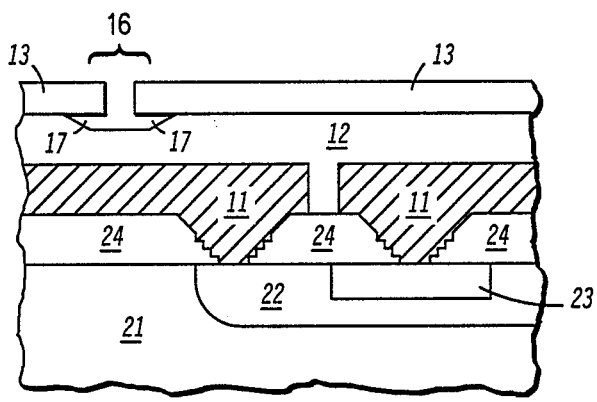

FIG. 1 illustrates an enlarged cross-sectional view of a small portion of a partially processed semiconductor device having multilayer metallization made in accordance with the present invention. Active device regions 22 and 23 are formed in semiconductor substrate 21. Interlayer dielectric 24 covers substrate 21 and active device regions 22 and 23. Contact windows are formed in interlayer dielectric 24 so as to expose portions of active device regions 22 and 23. First interconnect layer 11 is formed of a conductive material on interlayer dielectric 24 to fill the contact windows and make electrical contact to active device regions 23 and 22. First interconnect layer 11 is patterned to define the various device interconnections which are desired. Interlayer dielectric 12 is then formed to cover first interconnect layer 11, and photoresist masking layer 13 is formed and patterned on interlayer dielectric 12. Interlayer dielectric 12 comprises an oxide, silicon nitride, or the like. Photoresist is a convenient material for layer 13, but those skilled in the art will be aware of other suitable masking materials such as oxides, nitrides, or the like.

Window 16 is formed in photoresist layer 13 so that the area of window 16 is the same as the desired contact area at the base of the via. Interlayer dielectric 12 is isotropically etched in a wet chemical etch using photoresist layer 13 as a mask. The isotropic etch process undercuts photoresist mask 13 and forms top portion 17 of the via sidewall, having sloped sidewalls and an essentially flat base region underneath window 16. It should be noted that the method of the present invention may be used to form the contact windows in interlayer dielectric 4 in which case the processes involved will be the same as those involved in the formation of the via in interlayer dielectric 12.

Figure 2:
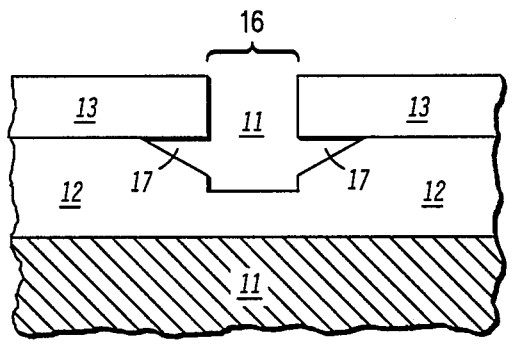

FIG. 2 illustrates an enlarged view of the top portion of the multilayer metal device shown in FIG. 1 further along in processing. Interlayer dielectric 12 is anisotropically etched to extend the via further into dielectric layer 12 underneath window 16, while leaving top portion 17 of the via, which is protected by photoresist layer 13, unchanged. A vertical sidewall is thus created at the edges of the anisotropically etched portion of the via. The height of the vertical sidewall is kept small in relation to the size of window 16 for reasons described hereinafter. Anisotropic dielectric etch processes, such as plasma etching or reactive ion etching (RIE) are well known, and may be performed, for example, in a batch dry etcher such as an AME 8110 RIE machine.

Figure 3:
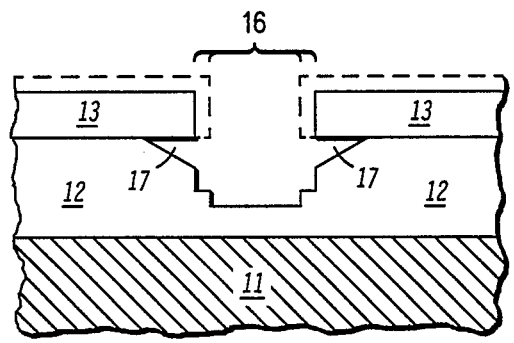

FIG. 3 illustrates the multilayer metal structure further along in processing. Photoresist mask 13 is isotropically etched to remove a portion of the top surface and sidewalls of photoresist layer 13. This step is also called a mask erosion step. The portion which is removed is illustrated by dashed lines 14 in FIG. 3. Preferably the mask erosion step is performed in the same apparatus as the anisotropic etch step, for example an RIE apparatus. It has been found that a combination of argon (150 cc/min) and oxygen (130 cc/min) at an operating pressure of 140-200 millitorr provides superior isotropy during the mask erosion step when an AME 8110 etcher is used. Of course, gas flow rates must be increased or decreased ratiometrically with the reactor volume when other dry etch machines are used. The mask erosion process does not significantly etch interlayer dielectric 12 either vertically or horizontally, so the profile of the anisotropically etched portion of interlayer dielectric 12 is unchanged by the mask erosion process. By removing a portion of the vertical sidewall of photoresist layer 13 a larger area of top portion 17 of the via is exposed. Dielectric layer 12 is subsequently dry etched, further extending the via towards interconnect layer 11, and creating a stair step edge between the base of the via and top portion 17 of the via sidewall. Preferably the mask erosion step and the dry etch step are performed in the same machine by altering the gas types, gas concentrations, and operating pressure during the etch process. The steps of mask erosion and dry etching dielectric layer 12 are repeated as shown in FIG. 4 any number of times. Typically, four repetitions provide a slope which can be conformably coated by second interconnect layer 18 shown in FIG. 5. Each repetition of the process adds a new stair step to the anisotropic etch portion of the via sidewall.

It is important that each repetition of the anisotropic etch process creates a vertical step that is small in relation to the size of window 16 so that second interconnect layer 18, shown in FIG. 5, will deposit conformably on the via sidewalls. The process conditions and materials for the dry etch process are described in the aforementioned U.S. Pat. No. 4,698,128 and are therefore incorporated herein by reference. The steps of anisotropically etching interlayer dielectric 12 and isotropically etching photoresist mask 13 are repeated until the via extends to interconnect layer 11, as shown in FIG. 5. The contact area at the base of the via is the same as the original area 16 formed in photoresist layer 13. To ensure that the contact area at the base of the via is the same as the area of window 16, the first anisotropic dielectric etch, described in reference to FIG. 2, is typically deeper than the subsequent anisotropic etches thus compensating for any variation in thickness of dielectric layer 12. Photoresist mask 13 is removed and second interconnect layer 18 is deposited by conventional deposition processes as shown in FIG. 1.

Each anisotropic etch step causes a thin polymer layer (not shown) to form on the via sidewall. The polymer layer is irregular in composition and thickness, and is therefore difficult to remove after the anisotropic etch step. During any anisotropic etch step which is longer than about six minutes, in particular the first anisotropic etch step which is typically longer in duration than the subsequent anisotropic etches, this polymer layer forms a veil inside the via. The polymer layer can, however, be removed during each anisotropic etch step by inserting a polymer etch cycle into the anisotropic etch cycle. The polymer etch cycle uses the same gas types and concentrations as the mask erosion cycle, but is shorter in duration. A gas mixture of argon (150 cc/min) and oxygen (50 cc/min) in an AME 8110 RIE etcher, for example, are effective at eliminating the polymer layer. Duration of the polymer etch cycle is typically 0.8 minutes. Polymer filaments which form during shorter anisotropic etch steps are effectively removed by the mask erosion steps. In this manner, the polymer layer is continuously removed, so that upon completion of the anisotropic etch step, the layer no longer exists.

By now it should be appreciated that a method of making a continuously sloped contact etch in thick dielectric layers has been provided. The top portion of the contact window is formed using a wet etch process which greatly reduces the time required for the etch and provides a sloped sidewall. The bottom portion of the contact window is formed by repeating a series of mask erosion steps and anisotropic etch steps, thus providing a step-wise sloped sidewall. The second interconnect layer will deposit conformably on the sloped via sidewalls so that a uniform, void-free contact is formed at the base of the via. The contact formed requires less processing time and offers improved yield and reliability.

We claim:

1. A method for making electrical contact between a first conductive layer and a second conductive layer of a semiconductor device wherein an insulating layer separates the first conductive layer and the second conductive layer, the method comprising the steps of: forming a masking film with a predetermined pattern on the surface of the insulating layer; isotropically etching a portion of the insulating layer exposed by the pattern; anisotropically etching the exposed portion of the insulating layer using the masking film as a mask; completing removal of the exposed portion of the insulating layer, thus exposing a portion of the first conductive layer, by repeating the steps of isotropically etching the masking film in a horizontal direction and anisotropically etching the insulating layer in a vertical direction;

removing the masking film; and forming the second conductive layer on top of the insulating layer in electrical contact with the first conductive layer.

2. The method of claim 1 wherein the step of isotropically etching the insulating layer comprises a wet chemical etch, and is performed in a separate apparatus from the step of anisotropically etching.

3. The method of claim 2 wherein the insulating layer comprises silicon dioxide.

4. The method of claim 1 wherein at least one anisotropic etch step further comprises a step of removing any polymers generated by the anisotropic etch process from the exposed insulating layer.

5. The method of claim 1 wherein the step of isotropically etching the masking film is performed in a reactive ion etcher using a reactive gas comprising a mixture of $O_2$ and an inert gas.

6. The method of claim 5 wherein the $O_2$ flow rate is approximately 130 cc/minute and the inert gas flow rate is approximately 150 cc/minute.

7. The method of claim 5 wherein the operating pressure of the reactive ion etcher is in the range of 140 millitorr to 200 millitorr during the step of isotropically etching the masking film.

8. The method of claim 1 wherein the insulating layer comprises silicon nitride.

9. A method for forming a hole in a layer formed on a semiconductor substrate comprising the steps of: forming a masking film with a predetermined pattern on the surface of the layer; isotropically etching a portion of the layer exposed by the pattern; anisotropically etching the portion of the exposed layer using the masking film as a mask; completing removal of the layer by repeating the steps of isotropically etching the masking film in a horizontal direction and anisotropically etching the portion of the layer in a vertical direction to form the hole in the layer.

10. The method of claim 9 wherein the step of isotropically etching the layer comprises a wet chemical etch, and is performed in a separate apparatus from the step of completing removal of the exposed layer.

11. The method of claim 9 wherein the step of anisotropically etching the portion of the layer further comprises a step of periodically removing any polymers generated by the anisotropic etch process from the exposed layer.

12. The method of claim 9 wherein the step of isotropically etching the masking film is performed in a reactive ion etcher using a reactive gas comprising a mixture of $O_2$ and an inert gas.

13. The method of claim 12 wherein the operating pressure of the reactive ion etcher is in the range of 140 millitorr to 200 millitorr during the step of isotropically etching the masking film.

* * * * *